United States Patent
Francos et al.

(10) Patent No.: US 6,801,581 B1
(45) Date of Patent: Oct. 5, 2004

(54) DC OFFSET CANCELLATION

(75) Inventors: Amir Francos, Tel Aviv (IL); Ilan Barak, Kfar Saba (IL); Daniel Yellin, Ra'anana (IL)

(73) Assignee: Intel Corporation, Santa Clara, CA (US)

( * ) Notice: Subject to any disclaimer, the term of this patent is extended or adjusted under 35 U.S.C. 154(b) by 622 days.

(21) Appl. No.: 09/661,127

(22) Filed: Sep. 13, 2000

(51) Int. Cl.$^7$ .......................... H04K 1/02; H04L 25/03; H04L 25/49

(52) U.S. Cl. ...................... 375/296; 375/285; 375/346; 455/296

(58) Field of Search ................................ 375/295, 296, 375/285, 298, 261, 346, 348; 455/296, 283, 284

(56) References Cited

U.S. PATENT DOCUMENTS

| | | | | |
|---|---|---|---|---|
| 4,878,029 A | * | 10/1989 | Saulnier et al. | 329/341 |
| 5,870,668 A | * | 2/1999 | Takano et al. | 455/126 |
| 6,018,650 A | | 1/2000 | Petsko et al. | |
| 6,035,004 A | * | 3/2000 | Nakata | 375/340 |
| 6,294,952 B1 | * | 9/2001 | Kato | 329/306 |
| 6,504,884 B1 | * | 1/2003 | Zvonar | 375/346 |
| 6,606,359 B1 | * | 8/2003 | Nag et al. | 375/348 |
| 2002/0018531 A1 | * | 2/2002 | Ratto | 375/297 |

FOREIGN PATENT DOCUMENTS

JP           410079693 A  *  3/1998

OTHER PUBLICATIONS

Matsuka Akihiko et al, Mar. 24, 1998, Derwent Publication No JP410079693A, Abstract only.*

Cavers, J.K., "the Effect of Quadrature Modulator and Demodulator Errors on Adaptive Digital Predistorters for Amplifier Linearization", IEEE Trans. On Vehicular Technology, vol. 46, No. 2, May 1997.

Sundstrom, L., Faulkner, M., Johansson, M., "Effects of REconstruction Filters in digital Predistortion Linearizers for RF Power Amplifiers", IEEE Trans. On Vehicular Technology, vol. 44, No. 1, Feb. 1995.

Wright, A.S., and Durtler, W.G., "Experimental Performance of an Adaptive Digital Linearized Power Amplifier", IEEE Trans. On Vehicular Technology, vol. 41, Nov. 1992.

Cavers, J.K., "New Methods for Adaption of Quadrature Modulators and Demodulators Amplifier LInearization Circuits", IEEE Trans. On Vehicular Technology, vol. 46, No. 3, Aug. 1997.

Sundstrom, L., Faulkner, M., and Johansson, M., "Quantization Analysis and Design of a Digital Predistortion Linearizer for RF Power Amplifiers", IEEE Trans. On Vehicular Technology, vol. 45, No. 4, Nov. 1996.

Lohtia, P.A., Goud, P.A., Englefield, C.G., "An Adaptive Digital Technique for Compensation for Analog Quadrature Modulator/Demodulator Impairments", Wireless 94.

* cited by examiner

*Primary Examiner*—Jean B. Corrielus
(74) *Attorney, Agent, or Firm*—Eitan, Pearl, Latzer & Cohen Zedek, LLP

(57) ABSTRACT

A transmitter has a transmission path with an IQ modulator and a feedback path with an IQ demodulator. DC offset is determined by estimating a DC offset of the IQ demodulator, adaptively estimating a DC offset of the IQ modulator at least partially from the demodulator DC offset, subtracting the estimated demodulator DC offset from the feedback path and subtracting the estimated modulator DC offset from the transmission path.

18 Claims, 3 Drawing Sheets

DC OFFSET CANCELLATION

FIELD OF THE INVENTION

The present invention relates to offset cancellation in general and to DC offset cancellation in mobile communication systems in particular.

BACKGROUND OF THE INVENTION

Many transmitters transmit digital information values that are generated in base band. The base band digital values are modulated onto a carrier high frequency signal and the combined signal is amplified before its transmission. The base band values may be complex values having real and imaginary components which are traditionally referred to as I and Q components, respectively. In the modulation of the base band signal and amplification of the modulation signal, inaccuracies are introduced. These inaccuracies may cause the transmitter to interfere with signals on carrier frequencies allocated to other transmitters and therefore should be at least partially canceled by the transmitter.

One source of inaccuracy is the IQ modulator and demodulator, which both suffer from a distortion mechanism called "local oscillator carrier feedthrough" and "DC offset". For example, the output of the demodulator can be modeled as:

$$S(t)=I(t)\cos(\omega t)-Q(t)\sin(\omega t)+LO(t) \quad \text{Equation 1}$$

where:

$$LO(t)=A\cos(\omega t+\phi). \quad \text{Equation 2}$$

The DC offset mechanism is generally due to LO(t), which is caused due to leakage of the signal of a local oscillator (used for carrier modulation) into the demodulator output. The same problem occurs at the modulator side.

BRIEF DESCRIPTION OF THE DRAWINGS

The present invention will be understood and appreciated more fully from the following detailed description taken in conjunction with the appended drawings in which.

Figure 1:
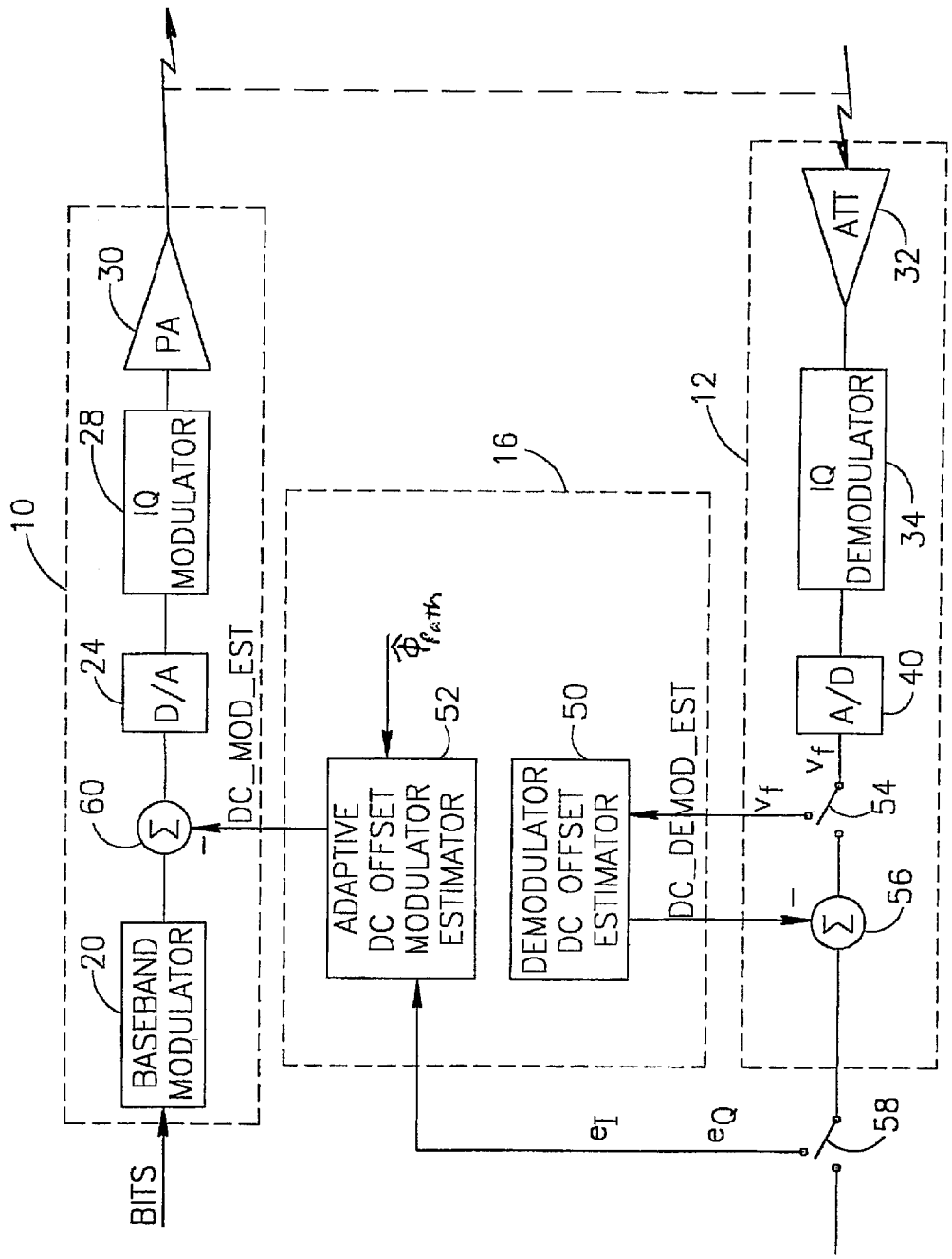
FIG. 1 is a block diagram illustration of transmission and feedback paths of a mobile communication unit or a base station, in accordance with an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description which follow are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a computer system bus.

Reference is now made to FIG. 1, which generally illustrates elements used in transmission for both mobile communication units and the base stations with which they communicate. While FIG. 1 presents certain elements, it will be appreciated that other mobile units and base stations may or may not include all of the elements shown in FIG. 1. FIG. 1 shows a transmission path 10, a feedback path 12 and a DC offset estimator 16. The transmission path 10 generally comprises some or all of the following elements: a baseband modulator 20, a digital to analog (D/A) converter 24, an IQ modulator 28 and a power amplifier 30. Baseband modulator 20 converts an incoming bit stream into a baseband signal having I and Q components. D/A converter 24 converts the shaped digital signal into an analog signal. IQ modulator 28 modulates the complex baseband signal into a radio frequency (RF) signal and power amplifier 30 transmits he RF signal.

Feedback path 12 comprises some or all of the following elements: an attenuator 32, an IQ demodulator 34 and an analog to digital (A/D) converter 40. Attenuator 32 receives the transmitted radio frequency and IQ demodulator 34 converts the radio frequency signal into a baseband one. Analog to digital converter 40 converts the signal into a digital one.

Figure 3:
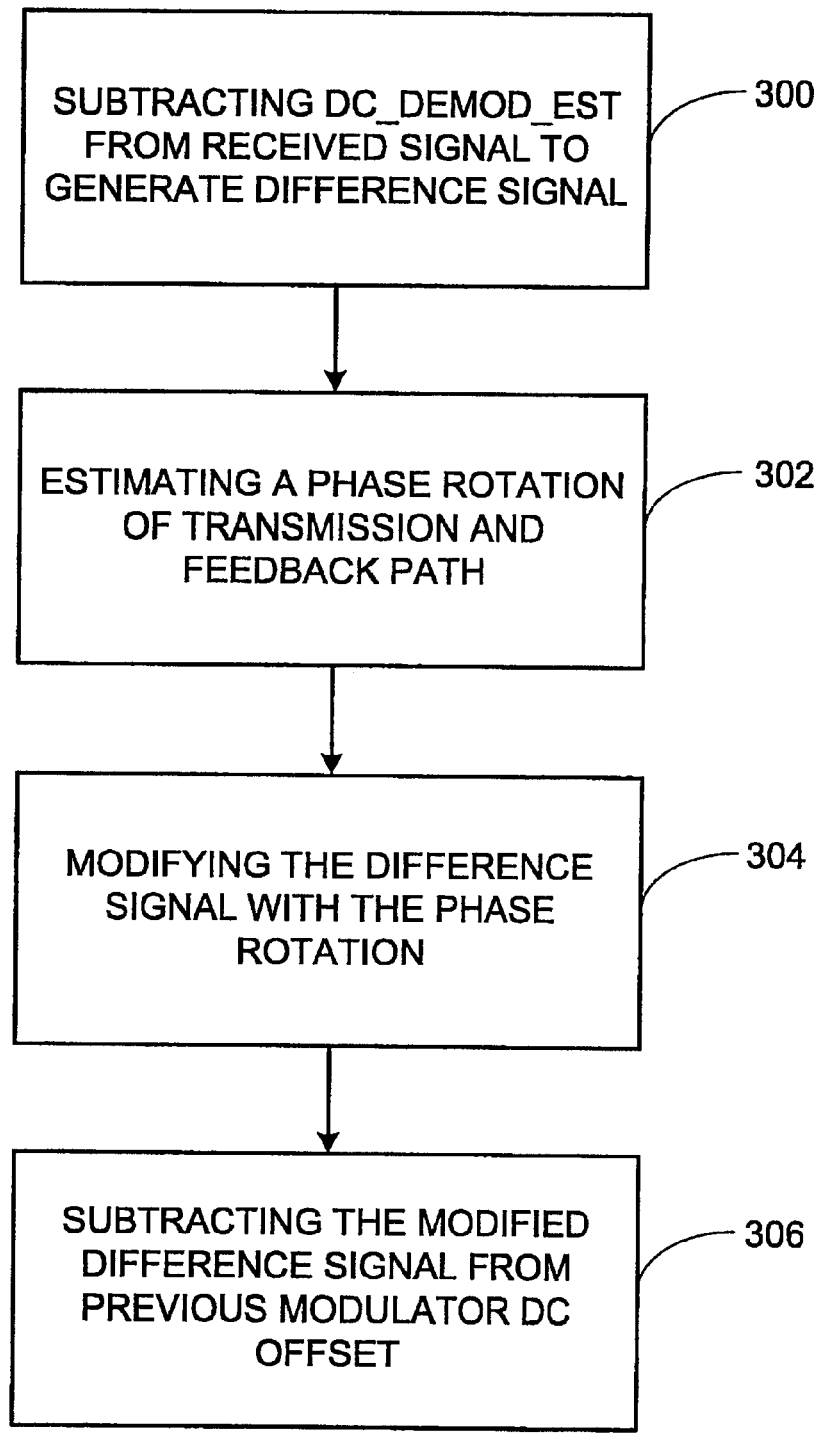
FIG. 3 is a flowchart illustration of a method in accordance with an embodiment of the present invention.

DC offset estimator 16 generally determines the DC offset due to IQ modulator 28 and IQ demodulator 34 from data from feedback path 12. DC offset estimator 16 typically comprises a demodulator DC offset estimator 50 and an adaptive modulator DC offset estimator 52. Through a logical switch 54 in feedback path 12, demodulator estimator 50 may receive the output $V_f$ of analog to digital converter 40 at predefined times. Demodulator estimator 50 may estimate the DC offset due to IQ demodulator 34 and the result, a signal labeled DC_DEMOD_EST, may be provided to a summer 56 in feedback path 12. When logical switch 54 connects analog to digital converter 40 to summer 56, summer 56 may subtract (block 300 of FIG. 3) the estimated DC offset, DC_DEMOD_EST, from the output of analog to digital converter 40, thereby providing a difference signal from which most, if not all, of the DC offset due to IQ demodulator 34 has been removed.

Typically, logical switch 54 provides its signal to demodulator estimator 50 during "non-transmission slots" (i.e. periods when no signal is being transmitted from or to the unit), At the same time, a "zero" signal, or one with a known sequence, may be injected to the input of IQ demodulator 34. This may be implemented by shutting down power amplifier 30 which results in an input to IQ demodulator 34 of generally zero. Thus, if there is any signal measured after analog to digital converter 40, it is due to the DC offset of IQ demodulator 34.

The output of IQ demodulator 34 may be measured for a set number of consecutive symbols NO_SYMBOLS. The two DC offset values DC_I_DEMOD_EST and DC_Q_DEMOD_EST of IQ demodulator 34 may be estimated as:

$$DC\_I\_DEMOD\_EST = \frac{1}{NO\_SYMBOLS} \sum_{i=1}^{NO\_SYMBOLS} \tilde{I} \qquad \text{Equation 3}$$

$$DC\_Q\_DEMOD\_EST = \frac{1}{NO\_SYMBOLS} \sum_{i=1}^{NO\_SYMBOLS} \tilde{Q}, \qquad \text{Equation 4}$$

where $\tilde{I}$, $\tilde{Q}$ are the real and imaginary parts, respectively, of the signal $V_f$ produced by analog to digital converter 40 and NO_SYMBOLS is the number of symbols used for averaging. In one embodiment, NO_SYMBOLS=5.

These two values may be provided to summer 56 to generally cancel the DC offset of IQ demodulator 34.

Once the demodulator DC offset has been estimated, the modulator DC offset may be calculated by operating both transmission path 10 and feedback path 12. Transmission path 10 also includes a summer 60, which may subtract the modulator DC offset, DC_MOD_EST, from the signal produced by baseband modulator 20. To determine the modulator DC offset a zero input signal is provided (typically during a non-transmission slot) to baseband modulator 20. In addition, adaptive modulator estimator 52 may assign initial values, typically obtained from a factory calibration, to summer 60. The factory calibrated values may be far away from the true (and unknown) values due to thermal and frequency changes.

The resultant signal is transmitted by power amplifier 30 and may be received by feedback path 12, operating with logical switch 54 connecting analog to digital converter 40 to summer 56. The result is that summer 56 produces two signals $e_I$ and $e_Q$ which are the feedback path output with the DC offset from IQ demodulator generally removed. During non-transmission slots, the two signals may be given mathematically as:

$$e_I = \tilde{I} - DC\_I\_DEMOD\_EST, \qquad \text{Equation 5}$$

$$e_Q = \tilde{Q} - DC\_Q\_DEMOD\_EST, \qquad \text{Equation 6}$$

where $\tilde{I}$, $\tilde{Q}$ are defined hereinabove.

When determining the DC offset of IQ modulator 28, a logical switch 58 may provide the two signals $e_I$ and $e_Q$ to adaptive modulator estimator 52, which then operates to minimize the signals $e_I^2$ and $e_Q^2$.

At the end of each symbol period, adaptive modulator estimator 52 may compute (block 306 of FIG. 3):

$$DC\_I\_MOD\_C_{new} = DC\_I\_MOD\_C_{old} - \mu_I \, \text{Re}\{e^{rot}_I\}, \qquad \text{Equation 7}$$

for the I channel and $$DC\_Q\_MOD\_C_{new} = DC\_Q\_MOD\_C_{old} - \mu_Q \, \text{Im}\{e^{rot}_Q\}, \qquad \text{Equation 8}$$

for the Q channel, where $\mu_I, \mu_Q$ are the step sizes which control the rate of adaptation, $0 \leq \mu_I \leq 1$, $0 \leq \mu_Q \leq 1$ and $e^{rot}_I$ and $e^{rot}_Q$ are rotated errors given hereinbelow by Equation 9. $DC\_I\_MOD\_C_{old}$ and $DC\_Q\_MOD\_C_{old}$ are the previous values of offset estimation and initially may be the factory calibrated values.

Alternatively to using the steepest descent iteration method (implemented in Equation 7 and Equation 8), other iteration methods as are known from optimization theory, such as the conjugate gradient equation and the quasi-Newton equation, may be used to minimize the signals $e_I^2$ and $e_Q^2$. In some embodiments of the invention, the selected iteration method is chosen as a tradeoff between the processing power of the transmitter and the required convergence speed of the output of adaptive estimator 52. If fast convergence is required and the transmitter has a relatively high processing power level, a fast convergence method that requires dense computation (e.g., the quasi-Newton method) may be used. If, however, low processing power utilization is more important than fast convergence, simpler methods, such as the steepest descent method, may be used.

There is often a phase rotation $\hat{\phi}_{path}$ along the path from the output of digital to analog converter 24 in transmission path 10 to the input to analog to digital converter 40 in feedback path 12. This phase rotation can be estimated (block 302 of FIG. 3) as described hereinbelow with respect to Equation 10 and then used to rotate (block 304 of FIG. 3) the errors $e_I$ and $e_Q$ according to:

$$e^{rot}_I = e_I e^{-j\hat{\phi}_{path}}$$

$$e^{rot}_Q = e_Q e^{-j\hat{\phi}_{path}} \qquad \text{Equation 9}$$

The phase $\hat{\phi}_{path}$ is measured in the first transmission slot when data is transmitted. The angle $\theta_{bip}$ of the baseband input signal is measured, per symbol, as is the angle $\theta_{out}$ of each symbol of the signal $V_f$ after analog to digital converter 40. The angle is defined as the angle in the complex plane of value $\tilde{I} + j\tilde{Q}$.

The phase $\hat{\phi}_{path}$ is the average value of the difference in the angles. Thus:

$$\hat{\phi}_{path} = avg(\theta_{out} - \theta_{bip}) \qquad \text{Equation 10}$$

During regular operation, logical switches 54 and 58 are typically closed and the previously estimated DC offset values may be utilized in summers 56 and 60. Thus, feedback path 12 produces signals with minimal, if any, demodulator DC offset and the transmitted signal may have the modulator DC offset removed.

If desired, and particularly during long transmission periods, the DC offset estimators 50 and 52 can be operated again. To do so, the data of the next non-transmission slot is used. The DC offset estimators 50 and 52 are then operated on this data.

Figure 2:
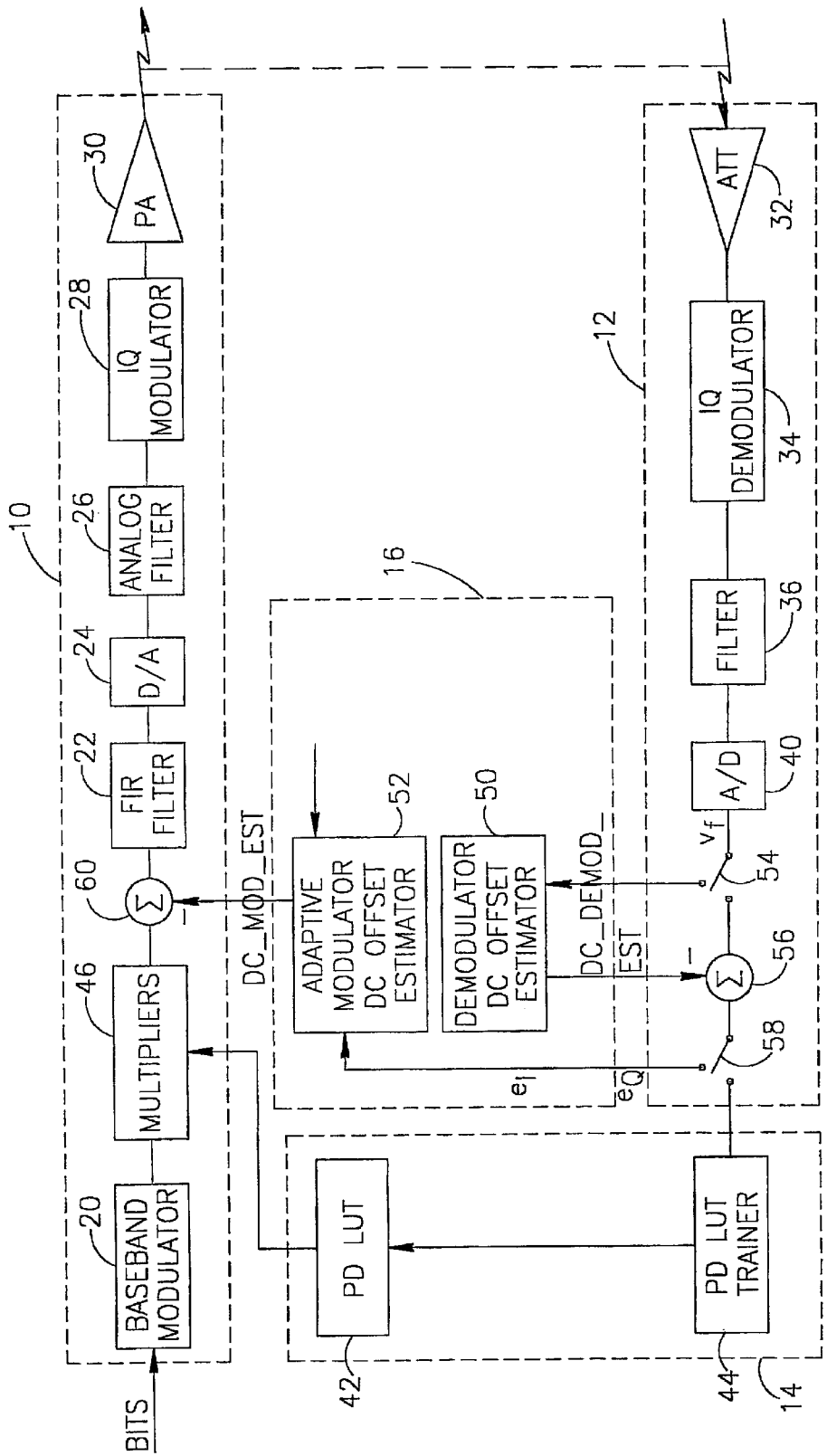
FIG. 2 is a block diagram illustration of an alternative embodiment of the present invention.

Reference is now made to FIG. 2, which illustrates a further embodiment of the invention implemented in a transmitter having a predistorter. Elements, which are similar to those of FIG. 1, have similar reference numerals.

FIG. 2 shows transmission path 10, feedback path 12, a predistorter 14 and DC offset estimator 16. The transmission path 10 generally comprises some or all of the following elements: baseband modulator 20, a finite impulse response (FIR) filter 22, digital to analog (D/A) converter 24, an analog filter 26, IQ modulator 28 and power amplifier 30. FIR filter 22 shapes the baseband signal as desired. Analog filter 26 filters the analog signal as necessary.

Feedback path 12 comprises some or all of the following elements: attenuator 32, IQ demodulator 34, a filter 36 and analog to digital (A/D) converter 40. Filter 36 limits any noise to the bandwidth of the demodulated signal.

Predistorter 14 comprises a predistorter (PD) lookup table (LUT) 42 and a PD LUT trainer 44. Pre-distorter 14 compensates for the non-linearity of power amplifier 30 and changes the signals entering power amplifier 30 such that the transmitted signals have substantially linear amplification (rather than the non-linear amplification, which occurs without the predistortion). Since the distortion changes due to temperature, aging and other characteristics of power amplifier 30, the predistortion values are updated by PD LUT trainer 44, based on feedback received from the output of power amplifier 30.

During regular transmission, PD LUT 42 predistorts the signal from baseband modulator 20 in order to compensate for the distortion produced by power amplifier 30. To do so, the output of PD LUT 42 is multiplied with the output of baseband modulator by multipliers 46 in transmission path 10. PD LUT trainer 44 regularly updates the values of PD LUT 42 based on data received along feedback path 12.

During regular operation, logical switches 54 and 58 are typically closed and any previously estimated DC offset values may be utilized in summers 56 and 60. Thus, PD LUT trainer 44 may receive signals with minimal, if any, demodulator DC offset and the transmitted signal may be both predistorted and may have the modulator DC offset removed.

DC offset estimator 16 operates as described hereinabove. Specifically, it operates during non-transmission slots and PD LUT 42 is disabled by indicating to multipliers 46 to pass the output of baseband modulator 20 rather than multiplying it by the output of PD LUT 42.

The methods and apparatus disclosed herein have been described without reference to specific hardware or software. Rather, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

It will be appreciated by persons skilled in the art that the present invention is not limited by what has been particularly shown and described herein above. Rather the scope of the invention is defined by the claims that follow:

What is claimed is:

1. A method for reducing a DC offset in a transmitter, the transmitter having a transmission path with an IQ modulator and a feedback path with an IQ demodulator, the method comprising:

providing a predetermined signal to the input of said IQ modulator and transmitting said signal; estimating a DC offset of said IQ demodulator from a received version of said transmitted signal;

adaptively estimating a DC offset of said IQ modulator at least partially from said demodulator DC offset;

subtracting said estimated demodulator DC offset from said feedback path; and subtracting said estimated modulator DC offset from said transmission path, wherein said estimating said demodulator DC offset comprises averaging a received signal along said feedback path, and wherein adaptively estimating said modulator DC offset comprises generating a difference signal between said received signal and said estimated demodulator DC offset and subtracting a modified rotated version of said difference signal from a previous value of said modulator DC offset.

2. A method according to claim 1 and wherein estimating said demodulator DC offset and adaptively estimating said modulator DC offset occur during non-transmission slots.

3. A method according to claim 2 and wherein said non-transmission slots are non-transmission slots of regular transmission.

4. A method according to claim 1 wherein adaptively estimating said modulator DC offset comprises estimating a phase rotation of said transmission and feedback paths and modifying said difference signal with said phase rotation.

5. A transmitter comprising:

a transmission path having an IQ modulator and a first summer;

a feedback path having an IQ demodulator and a second summer;

a demodulator DC offset estimator to average a received signal along said feedback path and to estimate a DC offset of said IQ demodulator;

an adaptive modulator DC offset estimator to estimate a DC offset of said IQ modulator at least partially from said demodulator DC offset, wherein said second summer is to subtract said estimated demodulator DC offset from said feedback path, wherein said first summer is to subtract said estimated modulator DC offset from said transmission path, and wherein said adaptive modulator DC offset estimator is to generate a difference signal between said received signal and said demodulator DC offset and to subtract a modified rotated version of said difference signal from a previous value of said modulator DC offset.

6. A transmitter according to claim 5 and wherein said demodulator DC offset estimator and said adaptive modulator DC offset estimator are to operate during non-transmission slots.

7. A transmitter according to claim 6 and wherein said non-transmission slots are non-transmission slots of regular transmission.

8. A transmitter according to claim 5 wherein said adaptive modulator DC offset estimator is to modify said difference signal with a phase rotation of said transmission and feedback paths.

9. A transmitter according to claim 5 which forms part of a base station.

10. A transmitter according to claim 5 which forms part of a mobile communication unit.

11. A DC offset reducer comprising:
- a transmission path having an IQ modulator and a first summer;
- a feedback path having an IQ demodulator and a second summer;
- a demodulator DC offset estimator to average a received signal along said feedback path and to estimate a DC offset of said IQ demodulator;
- an adaptive modulator DC offset estimator to estimate a DC offset of said IQ modulator at least partially from said demodulator DC offset,
- wherein said second summer is to subtract said estimated demodulator DC offset from said feedback path,
- wherein said first summer is to subtract said estimated modulator DC offset from said transmission path, and
- wherein said adaptive modulator DC offset estimator is to generate a difference signal between said received signal and said demodulator DC offset and to subtract a modified rotated version of said difference signal from a previous value of said modulator DC offset.

12. A DC offset reducer according to claim 11 and wherein said demodulator DC offset estimator and said adaptive modulator DC offset estimator are to operate during non-transmission slots.

13. A DC offset reducer according to claim 12 and wherein said non-transmission slots are non-transmission slots of regular transmission.

14. A DC offset reducer according to claim 11 wherein said adaptive modulator DC offset estimator is to modify said difference signal with a phase rotation of said transmission and feedback paths.

15. An integrated circuit (IC) having a transmitter, the transmitter comprising:
- a transmission path having an IQ modulator and a first summer;
- a feedback path having an IQ demodulator and a second summer;
- a demodulator DC offset estimator to average a received signal along said feedback path and to estimate a DC offset of said IQ demodulator;
- an adaptive modulator DC offset estimator to estimate a DC offset of said IQ modulator at least partially from said demodulator DC offset,
- wherein said second summer is to subtract said estimated demodulator DC offset from said feedback path,
- wherein said first summer is to subtract said estimated modulator DC offset from said transmission path, and
- wherein said adaptive modulator DC offset estimator is to generate a difference signal between said received signal and said demodulator DC offset and to subtract a modified rotated version of said difference signal from a previous value of said modulator DC offset.

16. An IC according to claim 15 and wherein said demodulator DC offset estimator and said adaptive modulator DC offset estimator are to operate during non-transmission slots.

17. An IC according to claim 16 and wherein said non-transmission slots are non-transmission slots of regular transmission.

18. An IC according to claim 15 wherein said adaptive modulator DC offset estimator is to modify said difference signal with a phase rotation of said transmission and feedback paths.

* * * * *